(12) United States Patent
Hsu et al.

(10) Patent No.: US 9,857,679 B2
(45) Date of Patent: Jan. 2, 2018

(54) LITHOGRAPHY MASK AND FABRICATING THE SAME

(71) Applicant: Taiwan Semiconductor Manufacturing Company, Ltd., Hsin-Chu (TW)

(72) Inventors: Pei-Cheng Hsu, Taipei (TW); Ta-Cheng Lien, Hsinchu County (TW); Tzu-Ling Liu, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 221 days.

(21) Appl. No.: 14/832,145

(22) Filed: Aug. 21, 2015

(65) Prior Publication Data
US 2017/0052442 A1 Feb. 23, 2017

(51) Int. Cl.
*G03F 1/76* (2012.01)
*G03F 1/26* (2012.01)
*G03F 1/60* (2012.01)
*G03F 1/80* (2012.01)

(52) U.S. Cl.
CPC .......... *G03F 1/76* (2013.01); *G03F 1/26* (2013.01); *G03F 1/60* (2013.01); *G03F 1/80* (2013.01)

(58) Field of Classification Search
CPC ..... G03F 1/54; G03F 1/76; G03F 1/80; G03F 1/26; G03F 1/60
USPC .......................................................... 430/5
See application file for complete search history.

(56) References Cited

U.S. PATENT DOCUMENTS

| 8,628,897 | B1 | 1/2014 | Lu et al. |
|---|---|---|---|
| 8,679,707 | B2 | 3/2014 | Lee et al. |
| 8,691,476 | B2 | 4/2014 | Yu et al. |
| 8,709,682 | B2 | 4/2014 | Chen et al. |
| 8,715,890 | B2 | 5/2014 | Tu et al. |
| 8,722,286 | B2 | 5/2014 | Yu et al. |
| 8,753,788 | B1 | 6/2014 | Yu et al. |
| 8,764,995 | B2 | 7/2014 | Chang et al. |
| 8,765,330 | B2 | 7/2014 | Shih et al. |
| 8,765,582 | B2 | 7/2014 | Hsu et al. |
| 8,785,084 | B2 | 7/2014 | Lu et al. |
| 8,828,625 | B2 | 9/2014 | Lu et al. |
| 8,841,047 | B2 | 9/2014 | Yu et al. |
| 8,877,409 | B2 | 11/2014 | Hsu et al. |
| 2010/0130016 | A1 | 5/2010 | DeVilliers |

FOREIGN PATENT DOCUMENTS

| JP | 2010072406 | 2/2010 |
|---|---|---|
| TW | 201025420 | 7/2010 |
| TW | 201133127 | 10/2011 |
| TW | 201407263 | 2/2014 |
| TW | 201407267 | 2/2014 |

*Primary Examiner* — Christopher G Young
(74) *Attorney, Agent, or Firm* — Haynes and Boone, LLP

(57) ABSTRACT

A mask includes a doped substrate having a first region, a second region and a third region. The doped substrate in the first region has a first thickness to define a first mask state and in the second region has a second thickness to define a second mask state. The second thickness is different than the first thickness. The mask also includes an absorption material layer disposed over the third region to define a border region.

20 Claims, 12 Drawing Sheets

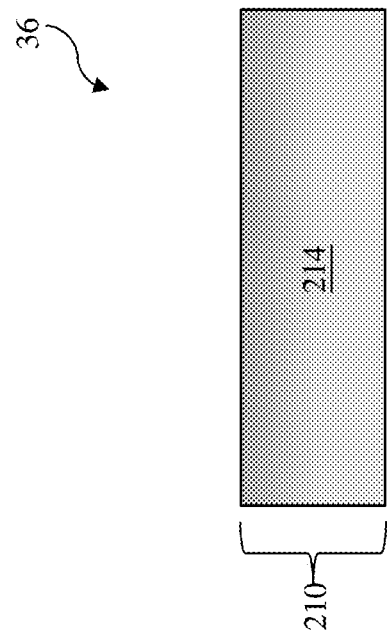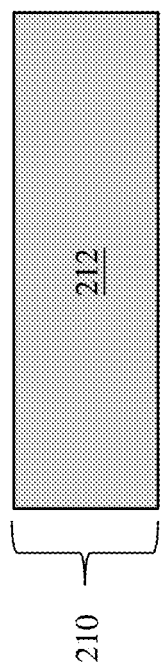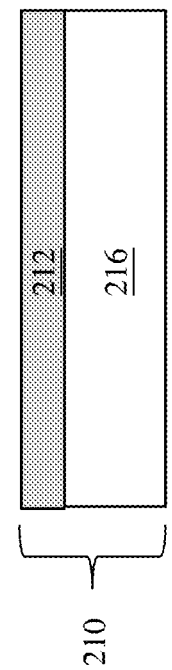

LITHOGRAPHY MASK AND FABRICATING THE SAME

BACKGROUND

The integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. One area is lithography mask fabrication. Although existing methods of fabricating IC devices have been generally adequate for their intended purposes, they have not been entirely satisfactory in all respects. For example, challenges rise to reduce charging effect induced in dry etching process during mask fabrication.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

FIGS. 3, 4A, 4B, 4C, 5, 6, 7, 8 and 9 are cross-sectional views of a mask, in portion, constructed in accordance with some embodiments.

DETAILED DESCRIPTION

Figure 1:
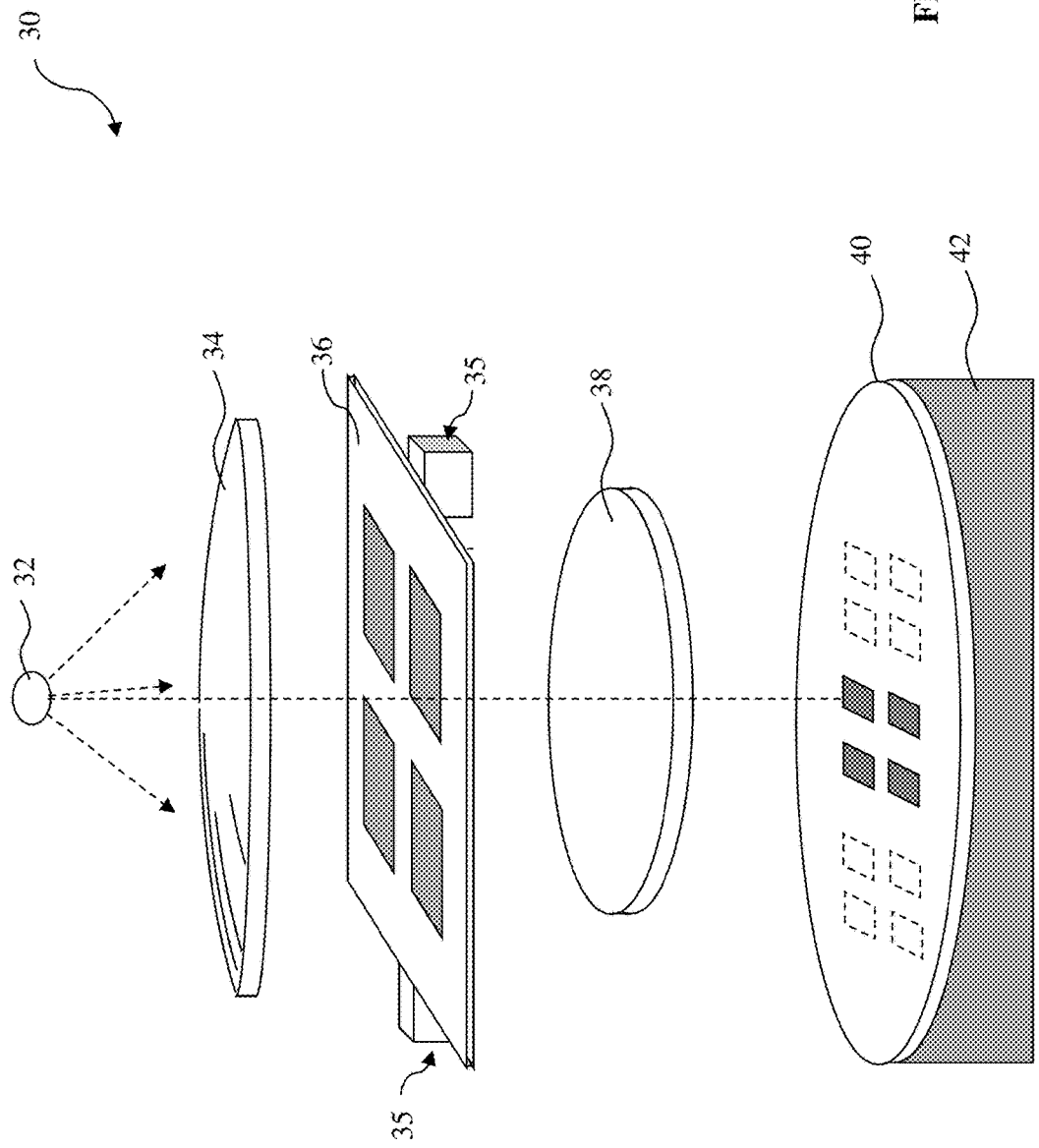
FIG. 1 is a schematic view of a lithography system and a mask structure constructed in accordance with some embodiments.

The present disclosure relates generally to lithography systems and a method of utilizing such systems. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, a lithography system 30 is illustrated in a schematic view, in accordance with some embodiments. The lithography system 30 is designed to perform a lithography exposure process to a radiation-sensitive material layer (e.g., photoresist layer or resist layer). In some embodiments, an exposure mode is implemented such that the image of a mask is formed on an integrated circuit (IC) substrate by one shot. In some embodiments, a step-and-exposure mode is implemented such that the image of the mask is repeatedly formed on a plurality of field regions on the IC substrate. In some embodiments, a step-and-scan mode is implemented such that the image of the mask is repeatedly scanned to a plurality of field regions on the IC substrate.

The lithography system 30 employs a radiation source 32 to generate radiation energy, such as ultraviolet (UV) light. In various embodiments, the radiation source 32 may be any suitable light source, such as a Krypton Fluoride (KrF) excimer laser with wavelength of 248 nm, an Argon Fluoride (ArF) excimer laser with a wavelength of 193 nm, a Fluoride ($F_2$) excimer laser with a wavelength of 157 nm, or other light sources having a longer wavelength. The radiation source 32 may be a continuous wave (CW) type or a pulse type. For example, when a light wavelength is less than about 248 nm, the radiation source 32 can be either a CW type or a pulse type. When a light wavelength is larger than about 248 nm, the radiation source 32 may be a pulse type with a time duration range from millisecond (ms) to femtosecond (fs). The radiation source 32 may include an optical source selected from the group consisting of ultraviolet (UV) source, deep UV (DUV) source, extreme UV (EUV) source, and X-ray source. The radiation source 32 may alternatively include a particle source selected from the group consisting of electron beam (E-Beam) source, ion beam source, and plasma source.

The lithography system 30 also includes an optical subsystem that receives the radiation energy from the radiation source 32, which modulates the radiation energy by the image of a mask and directs the radiation energy to a resist layer coated on the IC substrate. The optical subsystem includes an illuminator and a projection optics box. In some embodiments, the optical subsystem is designed to have a refractive mechanism. In this situation, the optical subsystem includes various refractive components, such as lenses.

In some other embodiment where the radiation energy is from excimer laser or EUV radiation source, the optical subsystem is designed to have a reflective mechanism. In this situation, the optical subsystem includes various reflective components, such as mirrors.

Particularly, the lithography system 30 employs an illuminator 34 (e.g., a condenser). In some embodiments where the optical subsystem has a refractive mechanism, the illuminator 34 may include a single lens or a lens module having multiple lenses (zone plates) and/or other lens components. For example, the illuminator 34 may include microlens arrays, shadow masks, and/or other structures designed to aid in directing radiation energy from the radiation source 32 onto a mask (also referred to as mask or reticle) 36.

The illuminator 34 is operable to provide an on-axis illumination (ONI) to illuminate the mask 36, where the ONI is designed according to various aspects of the present disclosure, as further described later. In some embodiments, an illumination aperture is configured to provide the on-axis illumination. In some embodiments, the illuminator 34 includes a plurality of lenses that are tunable for reconfiguration so to redirect the radiation light to different illumination positions, thereby achieving the ONI. In some other embodiments, a stage prior to the illuminator 34 may additionally include other lens or other optical components that are controllable to direct the radiation light to different illumination positions, thereby achieving the ONI.

In some other embodiments where the optical subsystem has a reflective mechanism, the illuminator 34 may employ a single mirror or a mirror system having multiple mirrors in order to direct light from the radiation source onto the mask, thereby achieving the ONI. The illuminator is operable to configure the mirrors to provide ONI to the mask. In one example, the mirrors of the illuminator are switchable to reflect EUV light to different illumination positions. In another embodiment, a stage prior to the illuminator 34 additionally include other switchable mirrors that are controllable to direct the EUV light to different illumination positions with the mirrors of the illuminator. Accordingly, the lithography system is able to achieve an on-axis illumination without sacrificing the illumination energy.

The lithography system 30 also includes a mask stage 35 configured to secure the mask 36 by a suitable clamping mechanism, such as vacuum clamping or e-chuck. The mask stage 35 is designed and configured to be operable for translational and rotational motions according to some embodiments. The mask 36 may be a transmissive mask or a reflective mask. In the present embodiment, the mask 36 is a transmissive mask such as one described in further detail later.

The lithography system 30 also employs a POB 38 projection optics box) for imaging the pattern of the mask 36 on to a target 40 (e.g. an IC substrate such as a semiconductor wafer or simply a wafer) secured on a substrate stage 42 of the lithography system 30. In some embodiments where the optical subsystem has a refractive mechanism, the POB 38 has refractive optics. The radiation light transmitted from the mask 36 is collected by the POB 38. In one embodiment, the POB 38 may include a magnification of less than one (thereby reducing the patterned image included in the radiation). In some other embodiments where the optical subsystem has a reflective mechanism, the POB 38 has refractive optics. The radiation reflected from the mask 36 (e.g., a patterned radiation) is collected by the POB 38.

The following description refers to the mask 36 and method of fabricating it. The mask 36 may be a transmissive mask, such as a binary mask (BIM), or a phase shift mask (PSM), which includes an alternative phase shift mask (alt. PSM) or an attenuated phase shift mask (att. PSM). In the present embodiment, the lithography mask fabrication includes two parts: forming a blank mask and patterning the blank mask to form a patterned mask. The blank mask is formed by depositing material layers on a substrate. The blank mask is then patterned to carry out a design of an integrated circuit (IC) device (or chip). The patterned mask is used in a lithography process to transfer the circuit patterns onto the target (e.g., wafer). The pattern can be transferred over and over onto multiple wafers through various lithography processes. Several masks (for example, a set of 15 to 30 masks) may be used to construct a complete IC device.

Figure 2:
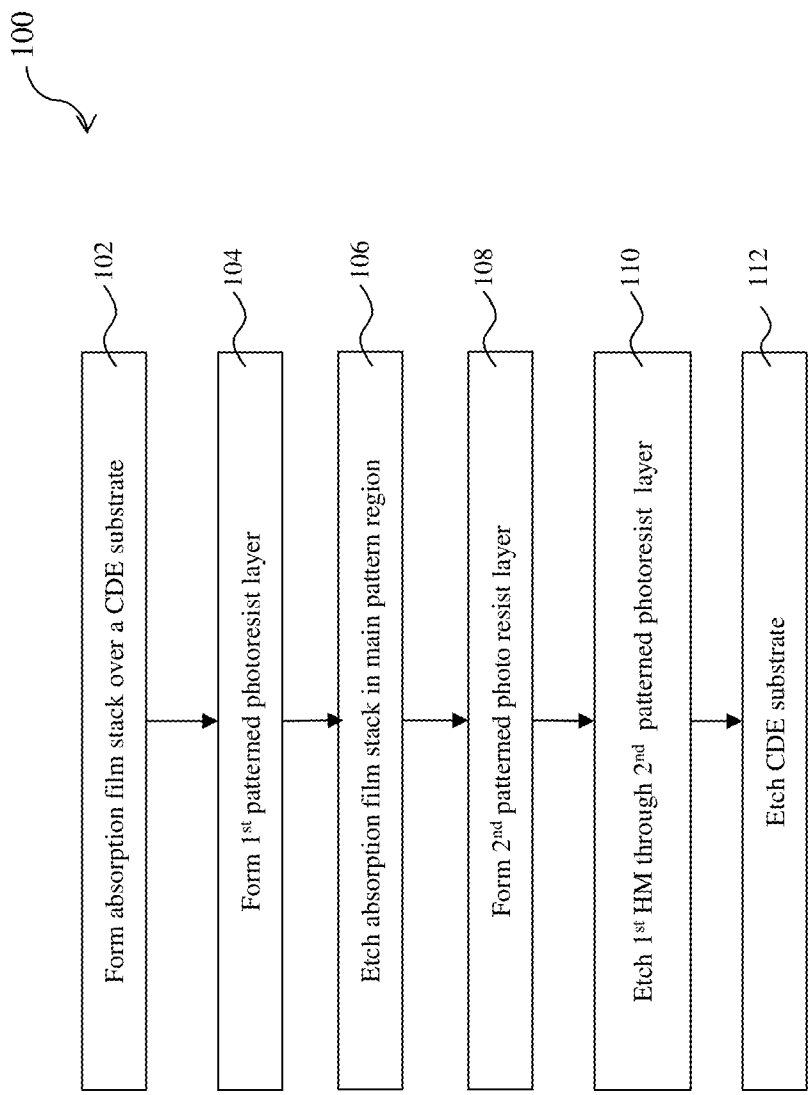
FIG. 2 is a flowchart of fabricating a lithography mask constructed in accordance with some embodiments.

FIG. 2 is a flowchart of a method 100 of making a lithography mask constructed according to aspects of the present disclosure. FIGS. 3 through 10A-10C are sectional views of embodiment of the mask 36 at various fabrication stages of the method 100. The mask 36 and the method 100 of making the same are collectively described with reference to FIGS. 2 through 10A-10C.

Figure 3:
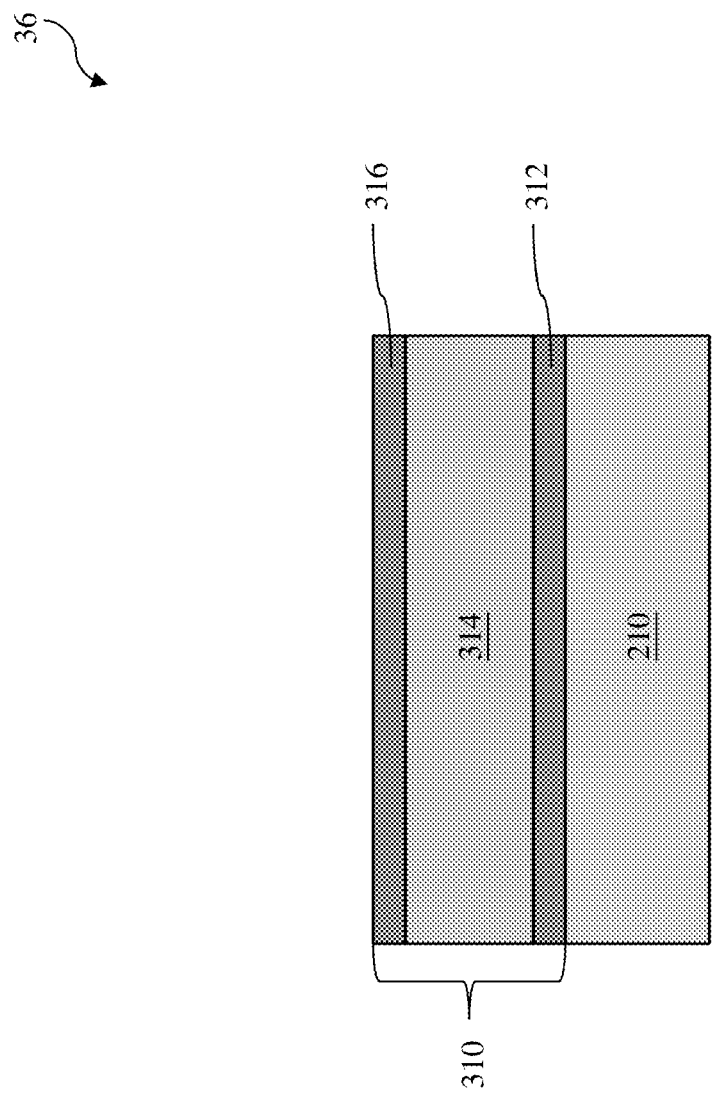

Referring FIGS. 2 and 3, the method 100 begins at step 102 by forming an absorption film stack 310 over a charging-dissipation-enhanced (CDE) substrate 210. The CDE substrate 210 may be formed by introducing doping species into a substrate material by a proper technique, such as ion implantation, to increasing electric conductivity of the substrate material. The substrate material may include transparent glass, such as fused silica, fused quartz, calcium fluoride ($CaF_2$), and/or other suitable materials. In the present embodiment, the substrate material includes quartz. The doping species may include metal or metal oxide, such as Ti, Sn, Cu, $RuO_2$, $MnO_2$, $GeO_2$. In the present embodiment, the CDE substrate 210 is chosen to provide an efficient dissipation path for accumulated charges on the CDE substrate 210 during a subsequent substrate etching process, which will be described in detail later.

In some embodiments, the CDE substrate 210 includes an uniformly doped substrate material 212, as shown in FIG. 4A. In some embodiments, the CDE substrate 210 includes a doped-in-gradient substrate material 214, as shown in FIG. 4B. The doped-in-gradient substrate material 214 has a dopant concentration gradient. For example, the dopant concentration is greater adjacent a side of the substrate material 214, upon which an absorption material layer will be disposed thereover than an opposing side of the substrate material 214. In some embodiments, the CDE substrate 210 includes a no-doped substrate material 216 with the doped substrate material 212 as its top layer, as shown in FIG. 4C.

For simplicity and clarity, the following description will be directed to the embodiment, which has the CDE substrate 210 including the uniformly doped substrate material 212. Those skilled in the art recognize that the method 100 would similarly apply to various embodiments, such as the embodiment, which has the CDE substrate 210 including the doped-in-gradient substrate material 214, or which has the CDE substrate 210 including the no-doped substrate material 216 with the doped substrate material 212 as its top layer.

Referring again to FIG. 3, the absorption film stack 310 includes a first hard mask (HM) 312, an absorption material layer 314 and a second HM 316. The first HM 312, formed over the CDE substrate 210, includes chromium (Cr), Cr oxide, Cr nitride, ruthenium (Ru), Ru compounds such as RuB, RuSi, and/or other suitable materials. The first HM 312 serves as an etching mask in a subsequent substrate etching process for an optimized etching profile and selectivity. The absorption material layer 314 is formed over the first HM 312. In some embodiments, the absorption material layer 314 includes molybdenum silicide (MoSi) or other suitable material. The absorption material layer 314 allows the radiation light from the radiation source 32 to partially pass through, such as about 6% for example. In some other embodiments, the absorption material layer 314 includes titanium nitride, tantalum nitride, tantalum, titanium, or aluminum-copper, palladium, tantalum nitride, aluminum oxide, molybdenum, other suitable material, and/or a combination thereof. The second HM 316, formed over the absorption material layer 314, may have similar material as the first HM 312 and also serves as an etching mask in a subsequent substrate etching process for an optimized etching profile and selectivity.

One or more of the material layers 312, 314 and 316 may be formed by various methods, including physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art. The MOD is a deposition technique by using a liquid-based method in a non-vacuum environment. By using MOD, a metal-organic precursor, dissolved in a solvent, is spin-coated onto a substrate and the solvent is evaporated. A vacuum ultraviolet (VUV) source is used to convert the metal-organic precursors to constituent metal elements.

Figure 5:
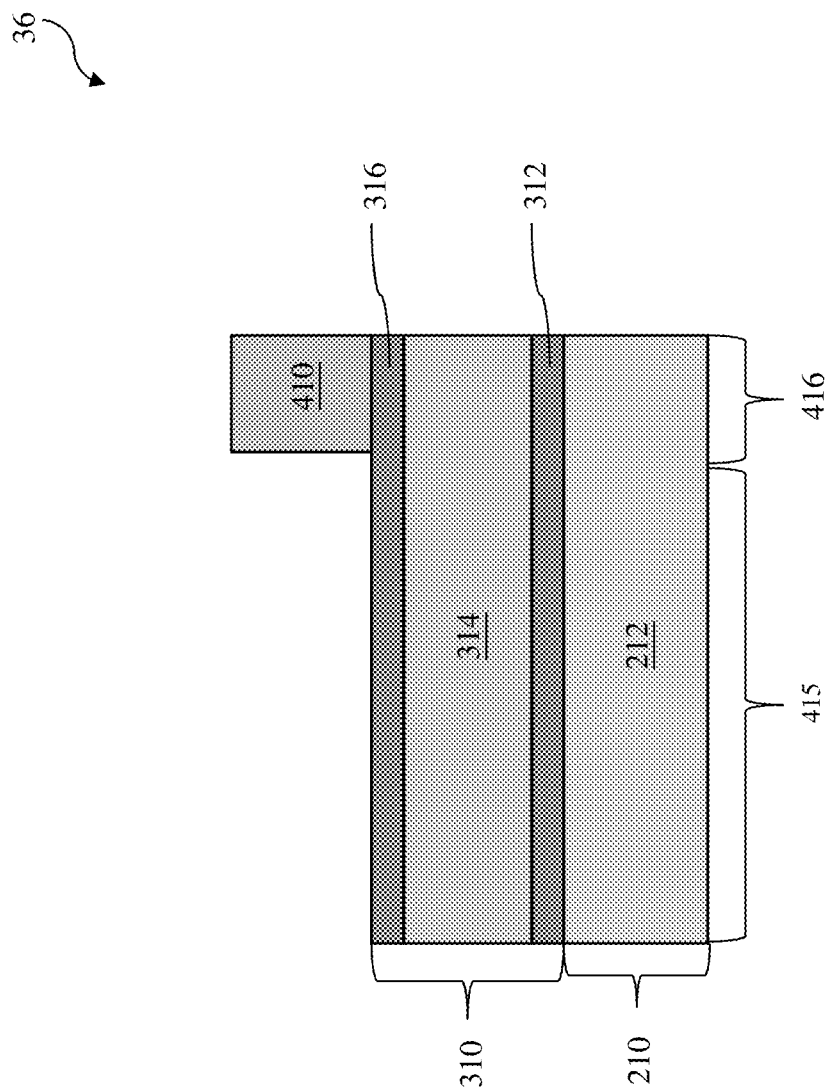

Referring FIGS. 2 and 5, the method 100 proceeds to step 104 by forming a first patterned photoresist layer 410 to define a first region 415 and a second region 416. The second region 416 is covered by the first patterned photoresist layer 410 while the first region 415 is un-covered. In present embodiment, the first region 415 is a main pattern region while the second region 416 is a border region. The first patterned photoresist layer 410 may be formed by a lithography process including resist coating (e.g., spin-on coating), soft baking, mask aligning, exposure, post-exposure baking, developing the resist, rinsing, drying (e.g., hard baking), other suitable processes, and/or combinations thereof. Alternatively, the exposure process is implemented or replaced by other proper methods such as maskless photolithography, electron-beam writing, direct-writing, and/or ion-beam writing.

Figure 6:
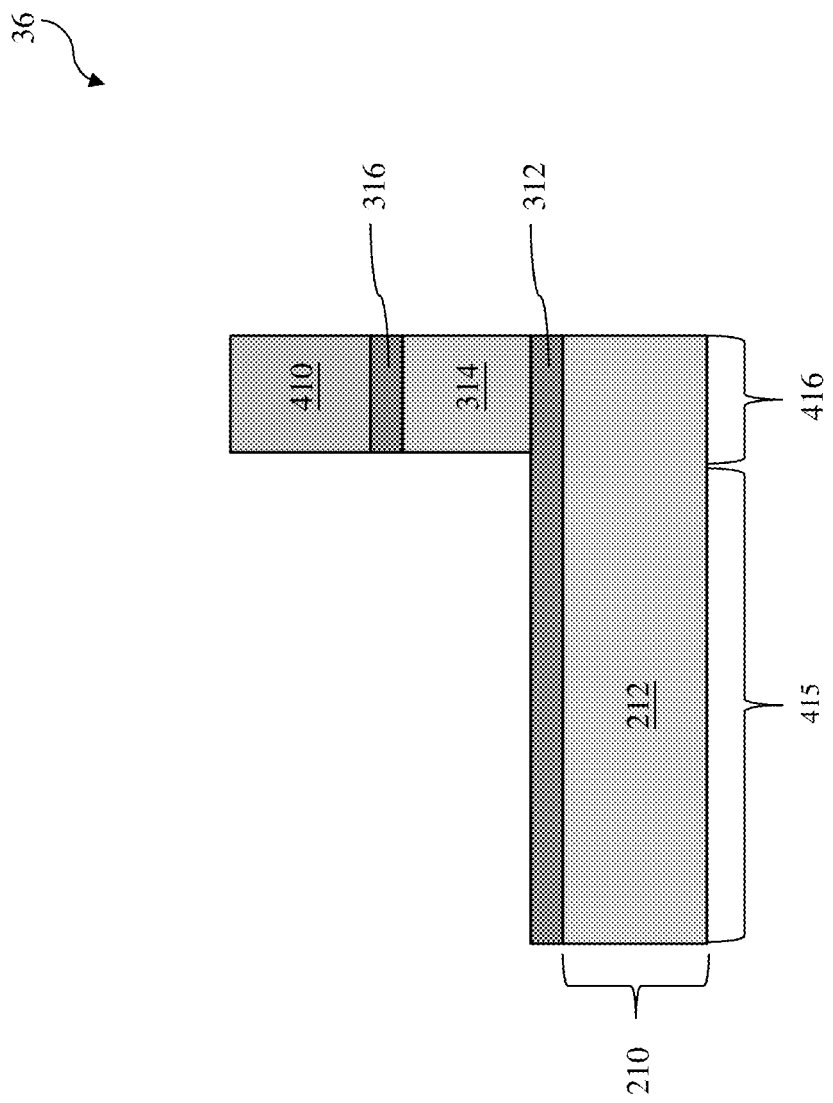

Referring FIGS. 2 and 6, the method 100 proceeds to step 106 by etching the second HM 316 and the absorption material layer 314 by using the first patterned photoresist layer 410 as a mask. The etching process may include dry plasma) etching, wet etching, and/or other etching methods. The dry etching process may implement by fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), oxygen-containing gas, iodine-containing gas, other suitable gases and/or plasmas, and/or combinations thereof. The etching process may include a multiple-step etching to gain etch selectivity, flexibility and desired etch profile.

In some embodiments, the second HM 316 is Cr and the absorption material layer 314 is MoSi. In such a scenario, a multiple-step dry etching is implemented. The plasma etching starts to remove the second HM 316 by chlorine-based gas, and then proceeds to a second etching step to remove the absorption material layer 314 by fluorine-based gas. Due to the nature of plasma chlorine-based gas and fluorine-based gas, the first step has a substantially high etching selectivity, particularly higher etch rate of Cr film relative to that of MoSi. The second etching step has a substantially high etching selectivity, particularly higher etch rate of MoSi film relative to that of Cr film. The first patterned photoresist layer 410 may be removed after the etching process.

Figure 7:
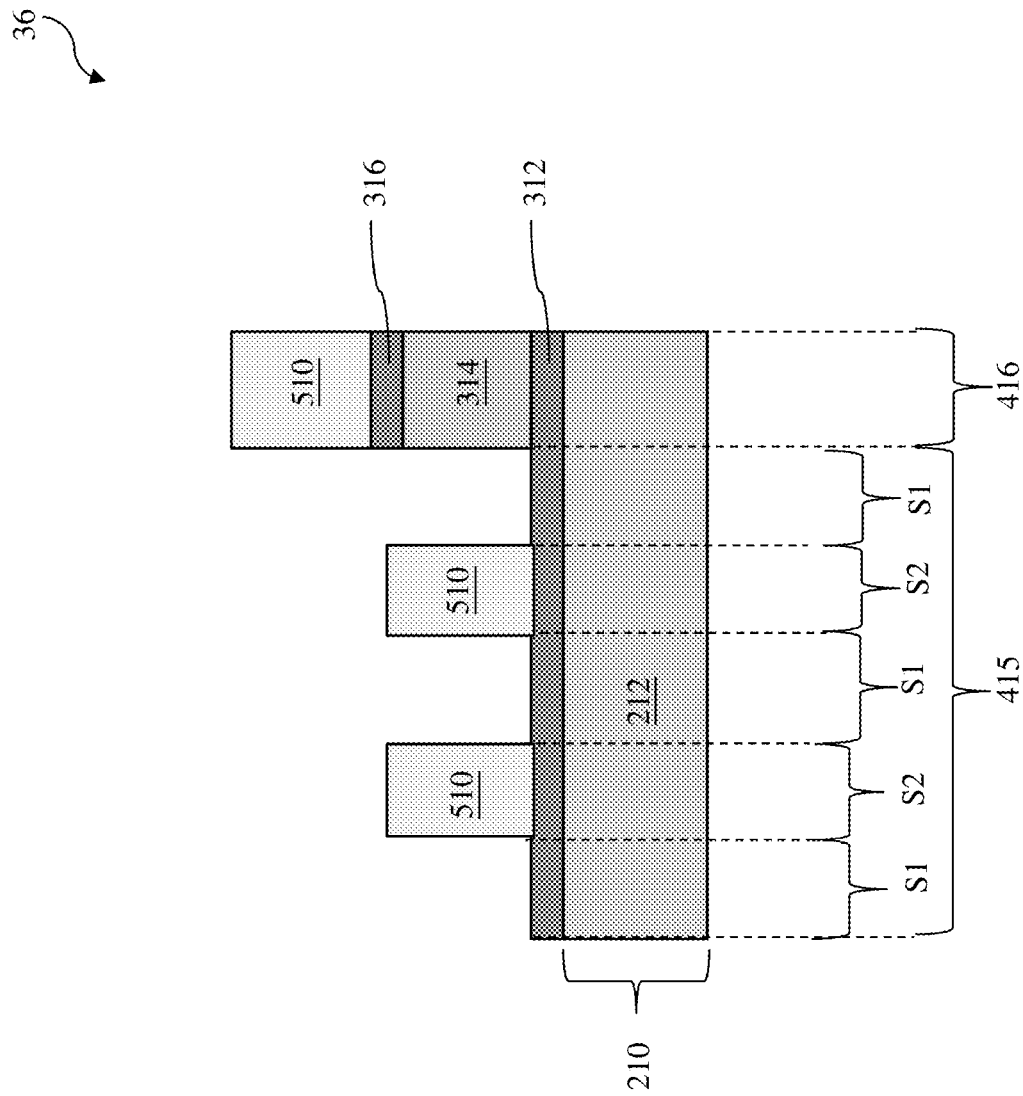

Referring FIGS. 2 and 7, the method 100 proceeds to step 108 by forming second patterned photoresist layer 510 over the main pattern region 415, including covering the border region 416, to define two mask states, a first state S1 and a second state S2, according to an IC layout pattern (or simply IC pattern). The two mask states, S1 and S2, define respectively various features of the IC pattern on the mask 36. In some embodiments, the two mask states, S1 and S2, will be formed such that they have same transmissivity but different optical phase (simply phase). For example, the two mask states, S1 and S2, are formed to have phase φ1 and φ2, respectively. The second patterned photoresist layer 510 is formed similarly in many respects to those discussed above the first patterned photoresist layer 410 in association with in FIG. 5.

Figure 8:
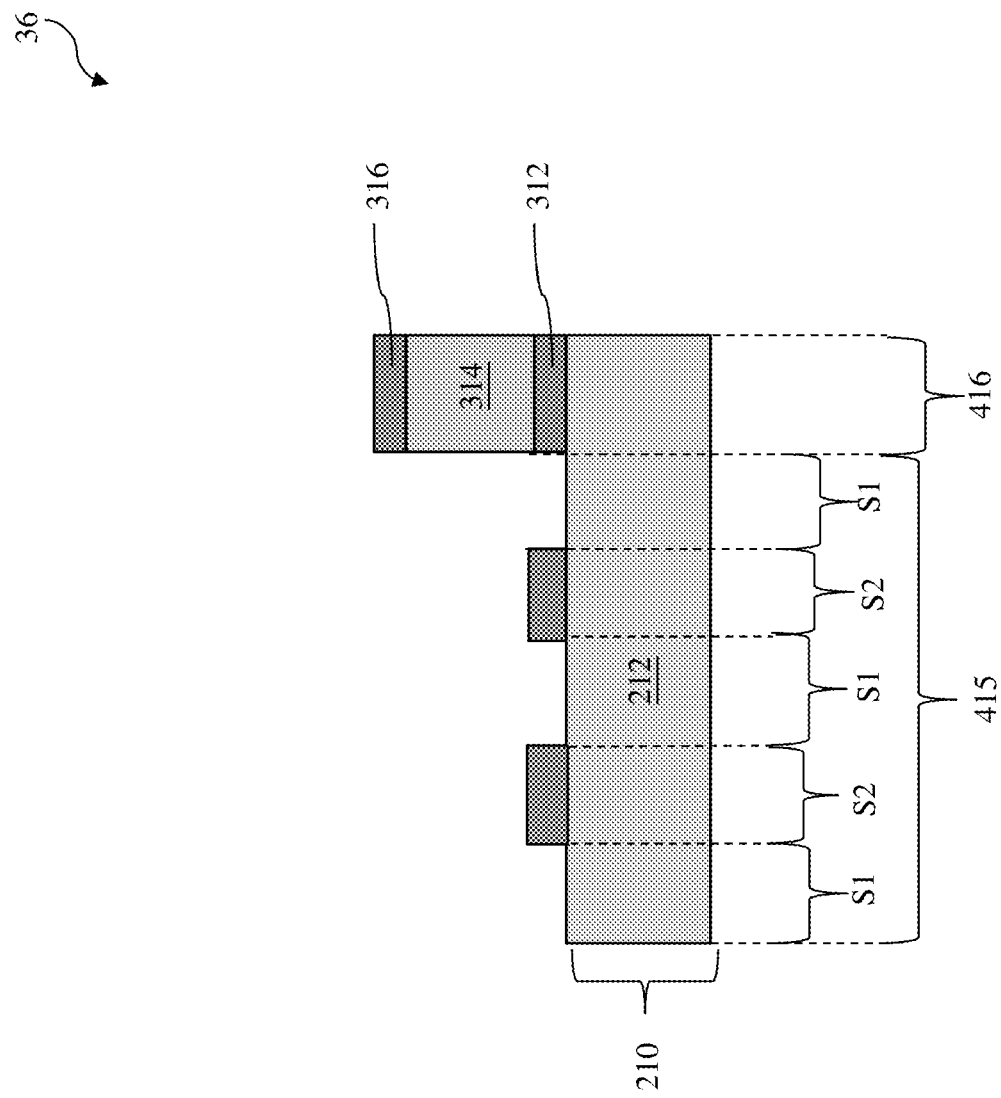

Referring FIGS. 2 and 8, the method 100 proceeds to step 110 by etching the first HM 312 through the second patterned photoresist layer 510 to pattern the first HM 312. The patterned first HM 312 defines the first and second mask states, S1 and S2. The etching process may include dry plasma) etching, wet etching, and/or other etching methods. In the present embodiment, the CDE substrate 210 is exposed in the first state S1 region while it is covered by the first HM 312 in the second state S2 region. The second patterned photoresist 510 is removed after patterning the first HM 312.

Figure 9:
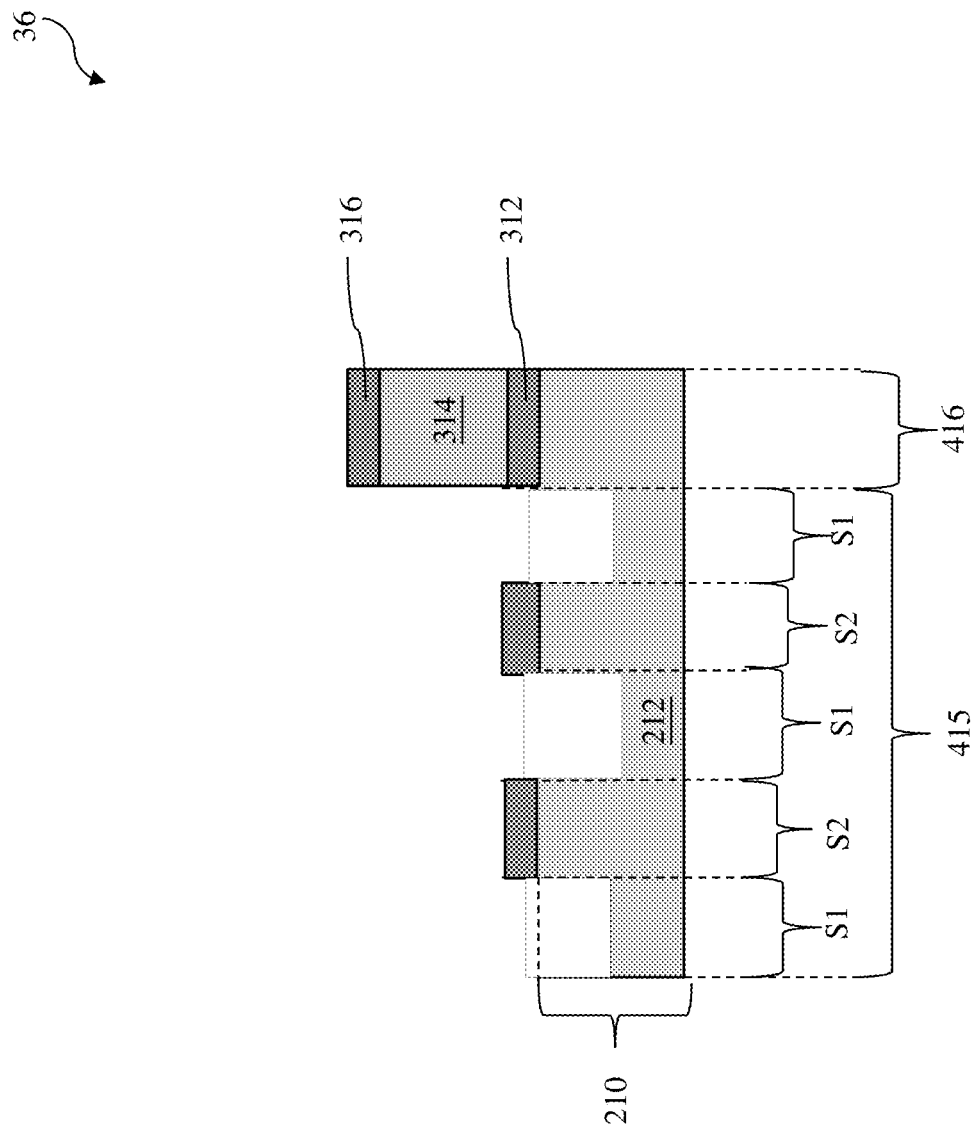

Referring FIGS. 2 and 9, the method 100 proceeds to step 112 by etching the CDE substrate 210 through the patterned first HM 312 to form the first mask state S1 and the second mask state S2 on the mask 36. The substrate etching process may include dry plasma) etching, wet etching, and/or other etching methods. In the present embodiment, the CDE substrate 210 is etched by a dry etching process utilizing fluorine-containing gas (e.g., $CF_4$, $SF_6$, $CH_2F_2$, $CHF_3$, and/or $C_2F_6$).

Typically, during a dry etch process, electronic charges may be accumulated on a being etched film if the film is an insulator or a high resistive material, which causes etching pattern distortion, such as nano-notches, which may impact adversely on depth of focus (DOF) and mask error enhancement factor (MEEF) of the mask 36 used in wafer printing process.

In the present embodiment, the CDE substrate 210 efficiently dissipates accumulated charge and reduces etching pattern distortion. The etch depth is controlled such that a portion of the CDE substrate 210 is removed to form the first mask state S1 while another portion of the CDE substrate 210 covered by the first HM 312 and it thickness remains intact, which forms the second mask state S2. During the substrate etching process, the second HM 316 protects the border region 416. The first and second HMs, 312 and 314, are removed after the substrate etching process.

Figure 10A:
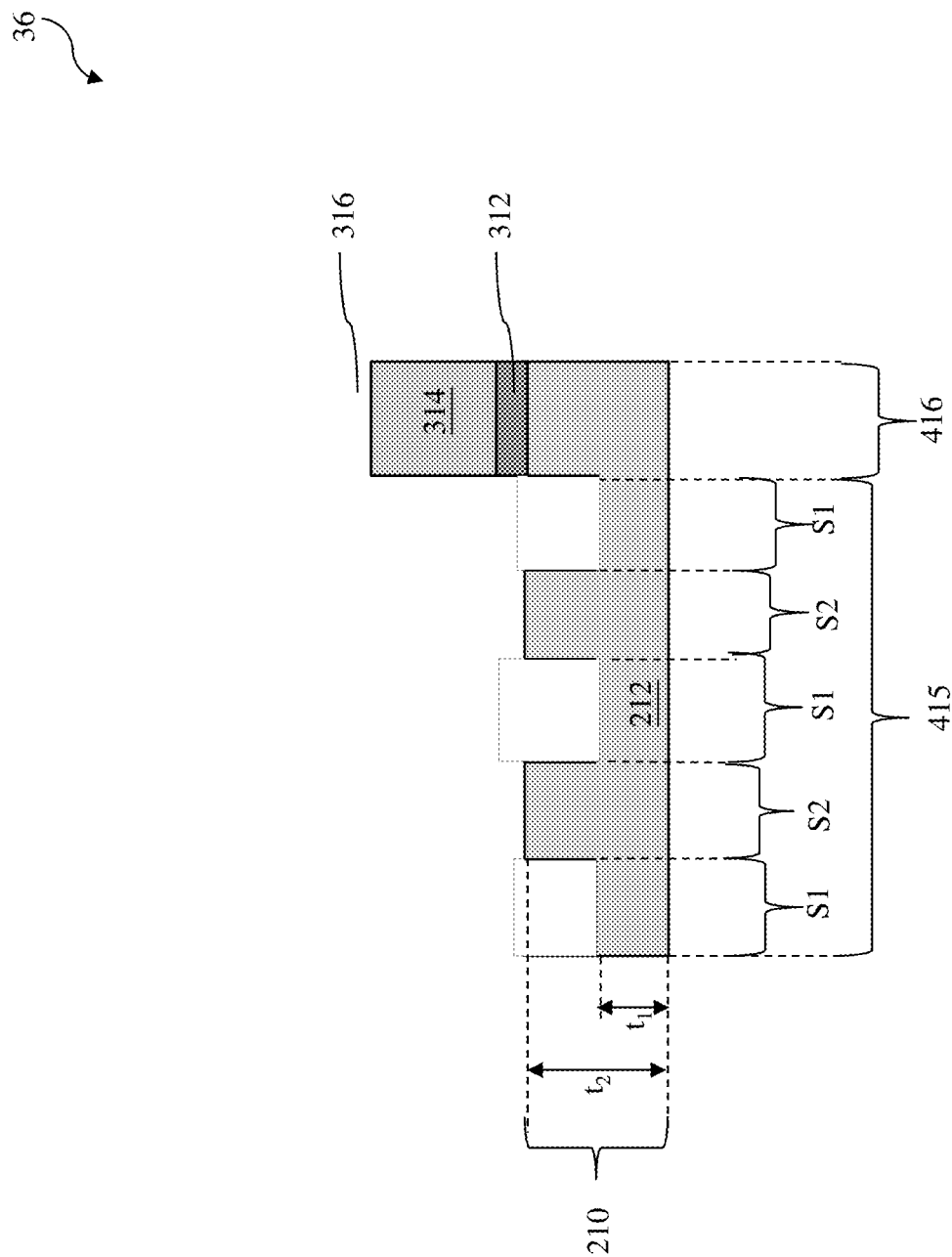
FIGS. 10A, 10B and 10C are sectional views of a mask, in portion, constructed in accordance with some embodiments.
Figure 10B:
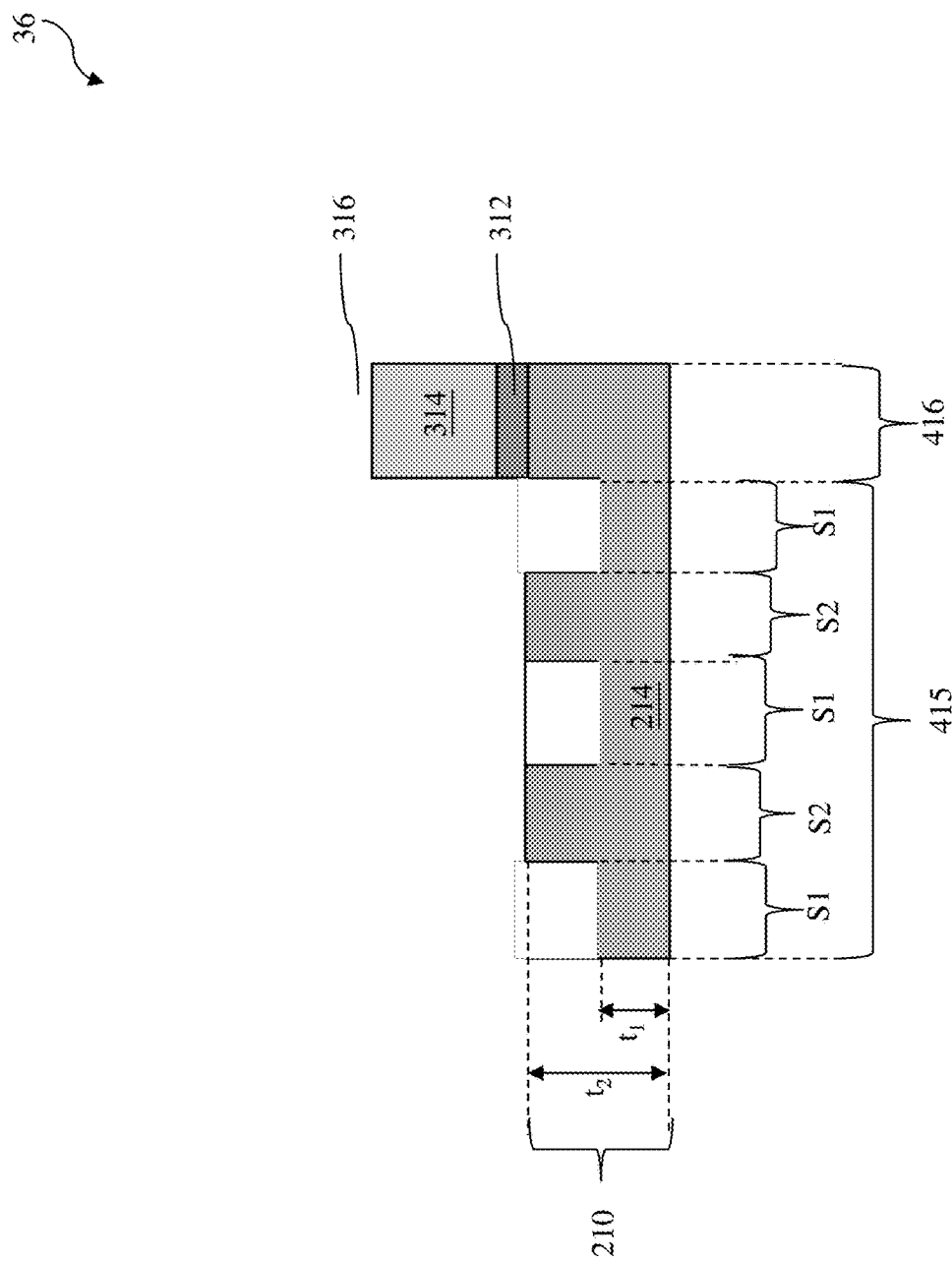
Figure 10C:
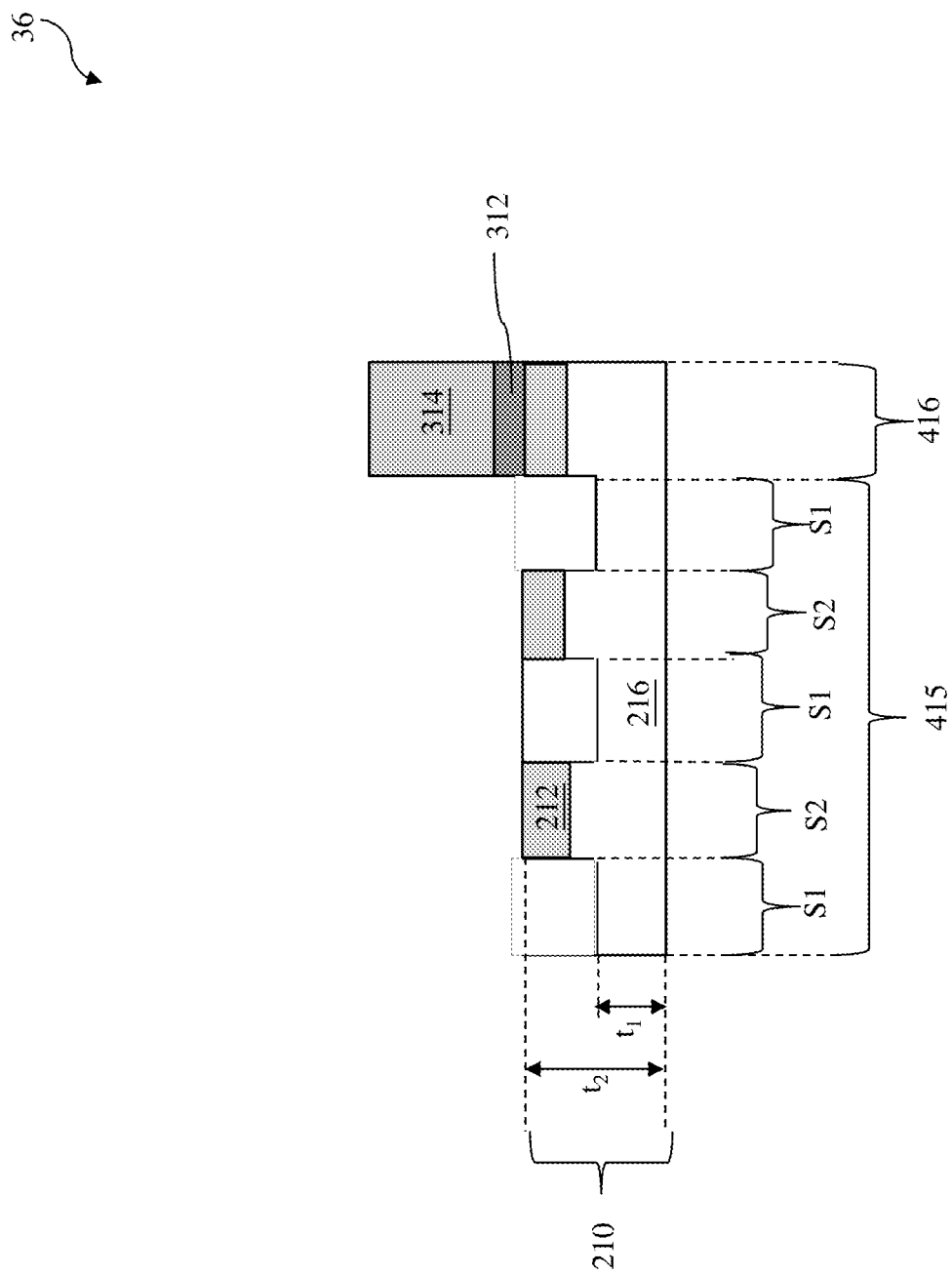

FIGS. 10A-10C show various masks processed via the above method 100 in which the CDE substrate is one the substrates disclosed in FIGS. 4A-4C. Referring to FIGS. 10A-10C (in conjunction with the process described with respect to FIGS. 4A-4C), the mask 36 is formed with two mask states S1 and S2 in the main pattern region 415 and a stack of films in the border region 416. In some embodiment, the first HM 312 is Cr. Since the Cr HM 312 is removed from the main pattern region 415, the mask 36 is sometimes referred to as a Cr-less mask.

In the present embodiment, the first mask state S1 and the second mask state S2 are formed of the same material, the CDE substrate 210, and thus they have same transmittance. The CDE substrate 210 has a first thickness $t_1$ in the first mask state S1 and a second thickness $t_2$ in the second mask state S2. By a proper configuration of the CDE substrate 210, such as film composition and thickness difference between the first thickness $t_1$ and the second thickness $t_2$, an optical phase difference between the mask state S1 and the mask state S2 is about 180° (out of phase).

FIG. 10A illustrates the first and second mask states, S1 and S2, are defined on the main pattern region 415 that includes the uniformed doped CDE substrate material 212 with the first and second thicknesses, t1 and t2, respectively. The border region 416 includes the first HM 312 disposed over the uniformed doped CDE substrate material 212

(having the second thickness $t_2$) and the absorption material layer 314 disposed over the first HM 312.

FIG. 10B is similar to FIG. 10A except as described differently below. Specifically, FIG. 10B illustrates that the first and second mask states, S1 and S2, are defined on the main pattern region 415 that includes the doped-in-gradient CDE substrate material 214. The border region 416 includes the first HM 312 disposed over the doped-in-gradient CDE substrate material 214 (having the second thickness $t_2$) and the absorption material layer 314 disposed over the first HM 312.

FIG. 10C is similar to FIG. 10A except as described differently below. Specifically, the first and second mask states, S1 and S2, are defined on the main pattern region 415 that includes the uniformity doped CDE substrate material 212 over the no-doped substrate material 216. The border region 416 includes the first HM 312 disposed over the uniformity doped CDE substrate material 212 and the absorption material layer 314 disposed over the first HM 312.

Based on the above, the present disclosure offers a chrome-less mask and a method of fabricating the mask. The mask has two mask states formed by a charging-dissipation-enhanced (CDE) substrate with two different thicknesses. The two mask stages are out of phase to each other. The method employs the CDE substrate to efficiently dissipate accumulated charge to reduce etching profile distortion, which demonstrates improvements on depth of focus (DOF) and mask error enhancement factor (MEEF) of the mask used in wafer printing process.

The present disclosure provides many different embodiments of a lithography mask. The mask includes a doped substrate having a first region, a second region and a third region. The doped substrate in the first region has a first thickness to define a first mask state and in the second region has a second thickness to define a second mask state. The second thickness is different than the first thickness. The mask also includes an absorption material layer disposed over the third region to define a border region.

In yet another embodiment, a mask includes a doped transparent substrate having a first mask state and a second mask that is different than the first mask state. The first mask state has a first thickness of the doped transparent substrate and the second mask state has a second thickness of the doped transparent substrate which is different than the first thickness. The first and second mask states are out of phase with respect to each other. The mask also includes an absorption material layer disposed over the doped transparent substrate to define a border region.

In yet another embodiment, a method includes forming a hard mask over a doped substrate. The doped substrate includes a dopant species selected from the group consisting of a metal and a metal oxide. The method also includes patterning the hard mask to define a first mask state and a second mask state, etching the doped substrate through the patterned hard mask to form the first mask state and a second mask state. The doped substrate in the first mask state has a first thickness and in the second mask state it has a second thickness that is different than the first thickness. The first and second mask states are out of phase with respect to each other. The method also includes removing the patterned hard mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A mask comprising:
   a doped transparent substrate having a first region, a second region and a third region, wherein the first region has a first thickness to define a first mask state, wherein the second region has a second thickness to define a second mask state, wherein the second thickness is different than the first thickness; and
   an absorption material layer disposed over the doped transparent substrate in the third region to define a border region.

2. The mask of claim 1, wherein the doped transparent substrate includes a uniformly doped material.

3. The mask of claim 1, wherein the transparent doped substrate has a dopant concentration gradient.

4. The mask of claim 3, wherein the dopant transparent concentration is greater adjacent a top surface of the doped substrate than a bottom surface of the doped substrate.

5. The mask of claim 1, wherein the doped transparent substrate includes a doped material layer disposed over a no-doped material layer.

6. The mask of claim 1, wherein doped transparent substrate includes a doping species selected from the group consisting of a metal and a metal oxide.

7. The mask of claim 1, wherein the first and second mask states are out of phase.

8. The mask of claim 1, wherein the first and second mask states have the same transmittance.

9. The mask of claim 1, wherein the absorption material layer includes molybdenum silicide (MoSi).

10. The mask of claim 1, further comprising a chromium (Cr) layer positioned between the doped substrate and the absorption material layer in the border region.

11. A mask, comprising:
    a doped transparent substrate having a first mask state and a second mask state that is different than the first mask state, wherein the first mask state has a first thickness of the doped transparent substrate and the second mask state has a second thickness of the doped transparent substrate which is different than the first thickness, wherein the first and second mask states are out of phase with respect to each other; and
    an absorption material layer disposed over the doped transparent substrate to define a border region.

12. The mask of claim 11, wherein the doped transparent substrate includes a uniformly doped material.

13. The mask of claim 11, wherein the doped transparent substrate has a dopant concentration gradient.

14. The mask of claim 13, wherein the dopant concentration is greater adjacent a side of the doped transparent substrate upon which the absorption material layer is disposed thereover than an opposing side of the doped transparent substrate.

15. The mask of claim 11, wherein the doped transparent substrate includes a doped material layer disposed over a no-doped material layer.

16. The mask of claim 11, wherein doped transparent substrate includes a doping species selected from the group consisting of a metal and a metal oxide.

17. The mask of claim 11, wherein the first and second mask states have the same transmittance.

18. A method of fabricating a mask comprising:
forming a hard mask over a doped transparent substrate, wherein the doped transparent substrate includes a dopant species selected from the group consisting of a metal and a metal oxide;
patterning the hard mask to define a first mask state and a second mask state in the doped transparent substrate;
etching the doped transparent substrate through the patterned hard mask to form the first mask state and the second mask state, wherein the doped transparent substrate constituting the first mask state has a first thickness and the doped transparent substrate constituting the second mask state has a second thickness that is different than the first thickness, wherein the first and second mask states are out of phase with respect to each other; and
removing the patterned hard mask.

19. The method of claim 18, further comprising forming the doped transparent substrate over an undoped substrate.

20. The method of claim 18, further comprising:
forming an absorption layer over the hard mask; and
patterning the absorption layer such that the first mask state and the second mask state are free of the absorption layer and a portion of the absorption layer is disposed in a border region of the mask.

* * * * *